United States Patent [19]

Koga

[11] Patent Number: 5,796,167
[45] Date of Patent: Aug. 18, 1998

[54] SEMICONDUCTOR DEVICE WITH BURIED WIRING LAYER AND FABRICATION PROCESS THEREOF

[75] Inventor: Hiroki Koga, Tokyo, Japan

[73] Assignee: NEC Corporation, Tokyo, Japan

[21] Appl. No.: 901,134

[22] Filed: Jul. 28, 1997

[30] Foreign Application Priority Data

Jul. 30, 1996 [JP] Japan ................................ 8-200651

[51] Int. Cl.$^6$ .................................................. H01L 23/48
[52] U.S. Cl. .................... 257/758; 257/347; 257/503; 365/149; 438/253
[58] Field of Search .......................... 257/66, 347, 503, 257/736, 758, 774; 365/149; 438/253

[56] References Cited

U.S. PATENT DOCUMENTS

| | | | |
|---|---|---|---|
| 5,414,285 | 5/1995 | Nishihara | 257/301 |
| 5,596,230 | 1/1997 | Hong | 257/758 |
| 5,670,812 | 9/1997 | Adler et al. | 257/347 |
| 5,702,969 | 12/1997 | Lee | 437/52 |

OTHER PUBLICATIONS

Y. Kohyama, et al., "Buried Bit–Line Cell for 64MB DRAMs," 1990 Symposium on VLSI Technology, Digest of Technical Papers, 1990; pp. 17–18.

Primary Examiner—Sara W. Crane
Assistant Examiner—Douglas A. Wille
Attorney, Agent, or Firm—Foley & Lardner

[57] ABSTRACT

An insulation layer is formed on a silicon substrate. An SOI layer is formed on the insulation layer. A groove is selectively formed in the insulation layer. A bit line is buried in a lower half of the groove. A connection conductor layer is selectively formed on the side wall surface of the groove on the buried bit line. The SOI layer and the buried bit line are connected electrically via the connection conductor layer. A cap insulation layer is formed to fill the groove on the buried bit line in a region where said connection conductor layer is not formed.

10 Claims, 9 Drawing Sheets

SEMICONDUCTOR DEVICE WITH BURIED WIRING LAYER AND FABRICATION PROCESS THEREOF

BACKGROUND OF THE INVENTION

1. Field of the Invention

The present invention relates to a semiconductor device with a buried wiring layer which can increase operation speed and thus improve performance, and a fabrication process thereof.

2. Description of the Prior Art

In the recent years, in the field of semiconductor device, it has been progressed to make semiconductor element smaller and smaller and to achieve increased package density. In this circumstance, as ultra high density semiconductor devices, such as for a memory device, a logic device or s forth, a device designed in a dimensional standard of 0.15 to 0.25 μm, have been developed. In order to attain such a high package density in the semiconductor device, it is necessary to reduce width of gate electrodes and other wiring and to reduce width of diffusion layers, and in conjunction therewith to thin down a thickness of component materials forming the semiconductor elements. Also, as means for attaining high package density of the semiconductor device, it is important to increase levels of multi-layer wiring of the wiring layer in the semiconductor device. For this purpose, there has been conventionally proposed various methods for burying the wiring layers within the semiconductor substrates.

As one example of the semiconductor device with a buried wiring layer, a memory cell structure of DRAM having buried bit lines has been disclosed in Y. Kohyama et al., "Buried Bit-Line Cell for 64 MB DRAMs", 1990 Symposium on VLSI Technology, Digest of Technical Papers, pp 17–18.

Figure 1A:
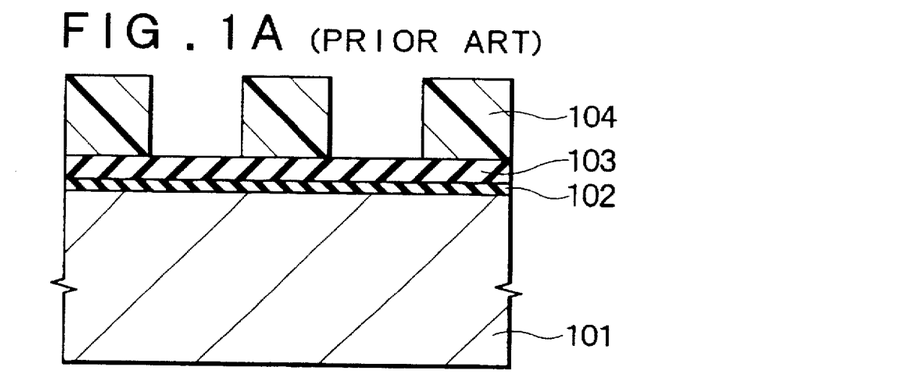
FIGS. 1A to 1E are sections showing the conventional fabrication process of memory cell of DRAM with buried bit line, in sequential order of process steps.

FIGS. 1A to 1E are sections showing the conventional fabrication process of memory cell of DRAM with the buried bit line, in sequential order of process steps. At first, as shown in FIG. 1A, a silicon oxide layer 102 is formed on a silicon substrate 101 by oxidizing the surface of the silicon substrate 101. Next, a silicon nitride layer 103 is formed on the entire surface of the silicon oxide layer 102. Thereafter, a resist mask 104 for forming grooves for buried bit lines, is selectively formed on the surface of the silicon nitride layer 103 utilizing lithographic technology.

Figure 1B:
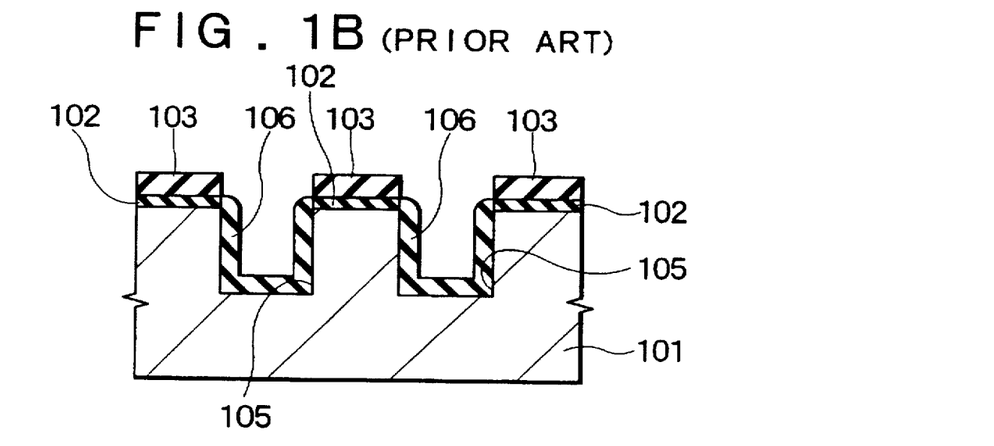

Subsequently, as shown in FIG. 1B, anisotropic dry etching is performed for selectively removing the silicon nitride layer 103 and the silicon oxide layer 102 with taking the resist mask 104 as a mask for etching. Then, removing the resist mask 104, anisotropic dry etching is performed for the silicon substrate 101 with taking the silicon nitride layer 103 as a mask to form grooves 105. Subsequently, thermal oxidation is performed for the inside surface of the grooves 105 is performed to form an insolating insulation layer 106 in a thickness of several tens nm on the side wall surface and the bottom surface of the grooves 105. During this thermal oxidation process, the silicon nitride layer 103 prevents the region other than the inside surface of the groove 105 from thermally oxidizing.

Figure 1C:
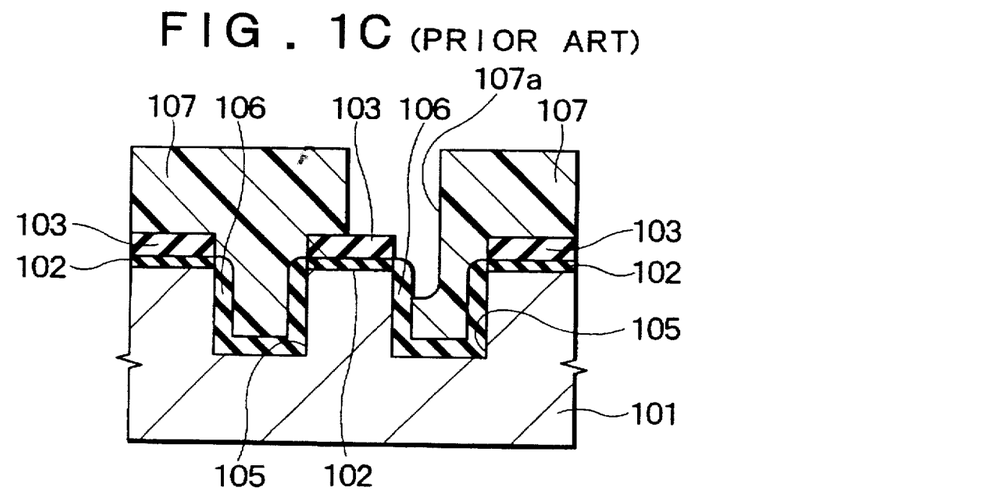

Subsequently, as shown in FIG. 1C, a resist mask 107 is selectively formed on the surface of these layers utilizing photolithography. An opening 107a exposing a part of the silicon nitride layer 103 and a part of the isolating insulation layer 106, is formed through the resist mask 107.

Figure 1D:
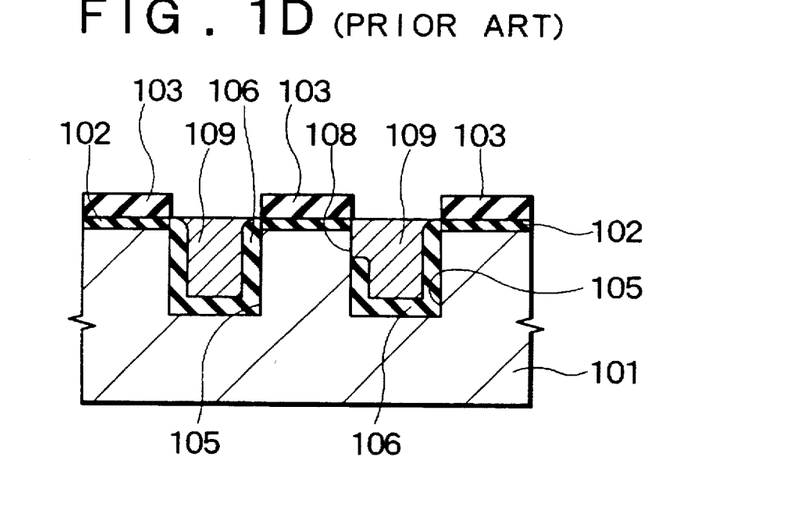

Thereafter, as shown in FIG. 1D, a part of the isolating insulation layer 106 is selectively etched and removed with taking the resist mask 107 as a mask to form a contact portion 108 for electrical connection. Then, a polycrystalline silicon layer containing high concentration of impurity is buried within the groove 105 to form the buried bit lines 109.

Figure 1E:
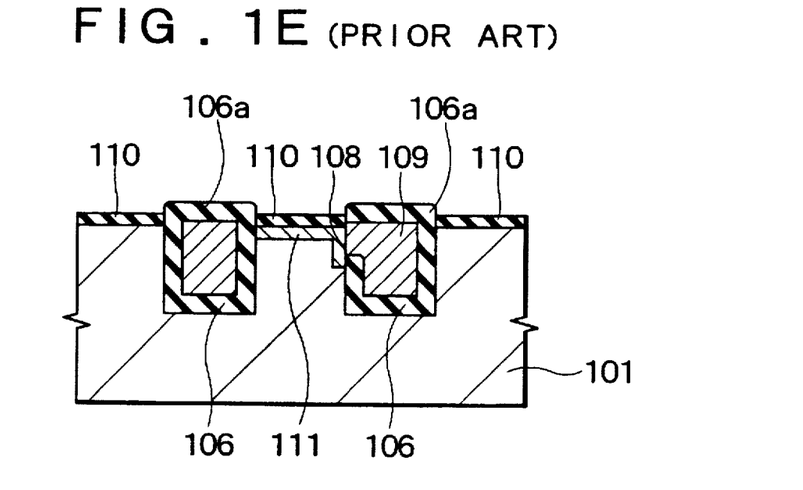

Then, as shown in FIG. 1E, by effecting thermal oxidation over the entire surface, an isolating insulation layers 106a of silicon oxide layer is formed on the upper surface of the buried bit line 109. Subsequently, the silicon nitride layer 103 and the silicon oxide layer 102 which are used as the mask during thermal oxidation process is removed by wet etching. Subsequently, the entire surface is oxidized to form a gate oxide layer 110 of a MOS transistor. Then, a gate electrode (not show) of the MOS transistor of the memory cell, which gate electrode is also serves as a word line, is formed on the predetermined position. Then, by selectively implanting an impurity having the same conductivity type as the impurity contained in the buried bit lines 109 into the silicon substrate 101, a diffusion layer 111 is selectively formed on the surface of the silicon substrate 101. Thus, the diffusion layer 111 and the buried bit lines 109 are electrically connected via the contact portion 108.

However, the memory cell fabricated through the conventional fabrication process shown FIGS. 1A to 1E, has the following two problems.

At first, in the conventional memory cell, a wiring resistance of the buried bit line becomes high. If the wiring resistance of the bit line becomes high, the operation speed of the semiconductor device becomes low to degrade the performance of the device. Discussion will be given for the reason why the wiring resistance of the buried bit line becomes high. For example, when a layout of the memory cell array of DRAM is designed, it is customary done to make width and interval of the bit lines minimum or the value close to the minimum in order to make an area of the chip as small as possible. The minimum design dimension is normally determined by an extreme of resolution in the photolithography.

As set forth above, in the conventional fabrication process, the inside surfaces of the grooves 105 are oxidized to form the isolating insulation layers 106 in a thickness of several tens nm, and subsequently, the buried bit lines 109 are formed. Therefore, the width of the buried bit line 109 becomes narrower than the width of the groove 105 immediately after formation thereof. If the opening region of the resist mask 104 is preliminarily set wider in consideration of reduction of the width of the groove 105, the width of the groove 105 becomes wider to successfully prevent the buried bit line 109 from being excessively narrow. However, in this method, higher package density of the semiconductor device cannot be achieved.

On the other hand, when the pattern of the grooves 105 is designed with the minimum design dimension, the width of the bit line 109 cannot be greater than a predetermined width. Accordingly, the width of the buried bit line 109 inherently becomes excessively narrow to cause high wiring resistance.

Secondly, a parasitic capacity of the buried bit line 109 is large. In DRAM, if the parasitic resistance of the buried bit line per unit length becomes large, number of memory cells connected per one sense amplifier can be smaller. This results in increasing of number of sense amplifier to cause increasing of the area of the chip. Also, when the parasitic capacity of the bit line becomes large, a period required for charging and discharging of the bit line becomes longer to cause lowering of the operation speed of the semiconductor device to lower performance of the device. The reason why the parasitic capacity in the buried bit line becomes large, will be discussed hereinafter.

In the conventional fabrication process, in order to insulate the bit line 109 from the silicon substrate 101, the bit line 109 is formed after formation of the isolating insulation layer 106 of the silicon oxide layer on the side wall surface and the bottom surface of the groove 105 by oxidizing the inside surface of the groove 105. The capacitance between the buried bit line 109 and the silicon substrate 101 is inversely proportional to the thickness of the isolating insulation layer 106 of the silicon oxide layer. Namely, the parasitic resistance of the buried bit line 109 becomes smaller at greater thickness of the isolating insulation layer 106.

On the other hand, as set forth above, when the thickness of isolating insulation layer 106 becomes larger, the wiring resistance of the buried bit line 109 becomes higher. Therefore, the thickness of the isolating insulation layer 106 cannot be excessively large. Accordingly, in order to reduce the wiring resistance of the buried bit line 109, the thickness of the isolating insulation layer 106 cannot be larger beyond several tens nm. As a result, the parasitic capacity of the buried bit line 109 becomes high.

SUMMARY OF THE INVENTION

Therefore, it is an object of the present invention to provide a semiconductor device with buried wiring layer, which can reduce a wiring resistance and a parasitic capacity of the buried wiring layer to achieve higher operation speed to enhance performance of the device, and permit reduction of chip area to achieve higher package density of the device, and a fabrication process of such semiconductor device.

A semiconductor device with a buried wiring layer, according to the present invention, has a semiconductor substrate. A first insulation layer is formed on the semiconductor substrate. A semiconductor layer is selectively formed on the first insulation layer. A groove is formed in the first insulation layer in contact with the semiconductor layer. The groove has a depth smaller than a thickness of the first insulation layer. A buried wiring layer is buried within the groove. A conductor portion connects the buried wiring layer and the semiconductor layer electrically. A second insulation layer is buried within the groove above the buried wiring layer. An upper wiring layer is formed above the second insulation layer.

The first insulation layer may be formed of silicon oxide, and the second insulation layer may be formed of silicon oxy-nitride.

Also, The upper wiring layer may extend above the semiconductor layer, and a third insulation layer may be formed between the upper wiring layer and the semiconductor layer.

A semiconductor device according to the present invention, may include an interlayer insulation layer formed above the upper wiring layer.

Also, an interval between a bottom surface of the groove and a surface of the semiconductor substrate may be greater than or equal to 100 nm. A thickness of the semiconductor layer may be greater than or equal to 30 nm.

A semiconductor device with a buried wiring layer, according to the present invention, has a semiconductor substrate. A first insulation layer is formed on the semiconductor substrate. A semiconductor layer is selectively formed on the first insulation layer. A groove is formed in the first insulation layer in contact with the semiconductor layer. The groove has a depth smaller than a thickness of the first insulation layer. A buried wiring layer is buried within the groove in contact with the semiconductor layer. A second insulation layer is formed on the buried wiring layer, the semiconductor layer and the first insulation layer. An upper wiring layer is formed above the second insulation layer.

A semiconductor device according to the present invention, may include an interlayer insulation layer formed above the upper wiring layer.

Also, an interval between a bottom surface of the groove and a surface of the semiconductor substrate may be greater than or equal to 100 nm. A thickness of the semiconductor layer may be greater than or equal to 30 nm.

A fabrication process of a semiconductor device with a buried wiring layer, according to the present invention, includes a step of forming a first insulation layer on a semiconductor substrate. Then, a semiconductor layer is formed on the first insulation layer. subsequently, a second insulation layer patterned into a predetermined shape is formed on the semiconductor layer. Thereafter, the semiconductor layer and the first insulation layer are etched with taking the second insulation layer as a mask to form a groove having a depth smaller than a thickness of the first insulation layer.

Then, a buried wiring layer is buried within the groove. A thickness of the buried wiring layer is smaller than a depth of the groove. Then, a third insulation layer is formed on the second insulation layer and within the groove. A chemical mechanical polishing is performed for the surface of the third insulation layer until a surface of the second insulation layer is exposed for leaving the third insulation layer within the groove above the buried wiring layer.

The second insulation layer on the semiconductor layer and the third insulation layer on the buried wiring layer are selectively removed to form an opening portion reaching to the buried wiring layer. A conductor portion is buried within the opening portion to electrically connect the semiconductor layer and the buried wiring layer.

A fabrication process of a semiconductor device, according to the present invention, may include a step of selectively etching and removing the second insulation layer after burying the conductor portion within the opening portion. Then, thermal oxidation may be performing for the surface of the conductor portion and the semiconductor layer exposed by etching of the second insulation layer. Then, the second insulation layer remained on the semiconductor layer may be removed. Then, a fourth insulation layer may be selectively formed on the semiconductor layer exposed by removing of the second insulation layer. And then, an upper wiring layer may be formed on the fourth insulation layer.

Also, the second insulation layer and the third insulation layer may be formed of mutually different materials. The second insulation layer may be formed of silicon nitride and the third insulation layer may be formed of silicon oxy-nitride.

A fabrication process of a semiconductor device with a buried wiring layer, according to the present invention, includes a step of forming a first insulation layer on a semiconductor substrate. Then, a semiconductor layer is formed on the first insulation layer. Subsequently, a second insulation layer patterned into a predetermined shape is formed on the semiconductor layer. Thereafter, the semiconductor layer and the first insulation layer are etched with taking the second insulation layer as a mask to form a groove having a depth smaller than a thickness of the first insulation layer.

Then, a buried wiring layer is buried in contact with the semiconductor layer within the groove. Then, a protective insulation layer covering the second insulation layer and the buried wiring layer is selectively formed. Then, the second insulation layer in a region not covered with the protective insulation layer is removed. Then, thermal oxidation is performed for the surface of the buried wiring layer and the semiconductor layer with taking the protective insulation layer as a mask for forming a third insulation layer.

The protective insulation layer may be formed of silicon nitride and the third insulation layer may be formed of silicon oxide. Also, the protective insulation layer may be formed of silicon oxide and the third insulation layer may be formed of silicon nitride.

In the present invention, since the buried wiring layer is formed within the insulation layer on the semiconductor substrate, it becomes unnecessary to form an insulation layer within the groove for insulating between the buried wiring layer and the semiconductor substrate. Thus, it becomes unnecessary to make the wiring layer narrower to successfully prevent a wiring resistance from being increased.

In the present invention, since a interval between the buried wiring layer and the surface of the semiconductor substrate is sufficiently thick in comparison with the conventional structure, the parasitic capacitance of the buried wiring layer becomes small.

As set forth above, in the present invention, the wiring resistance of the buried wiring can be made low and the parasitic capacitance can be made small to make the operation speed of the semiconductor device higher to improve performance. Also, even if the width of the groove to be formed the buried wiring layer is defined by an extreme of resolution in the photolithography, high performance semiconductor device can be obtained. Therefore, the chip area can be reduced to contribute for increasing of package density of the semiconductor device.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to be present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessary obscure the present invention.

Figure 2:
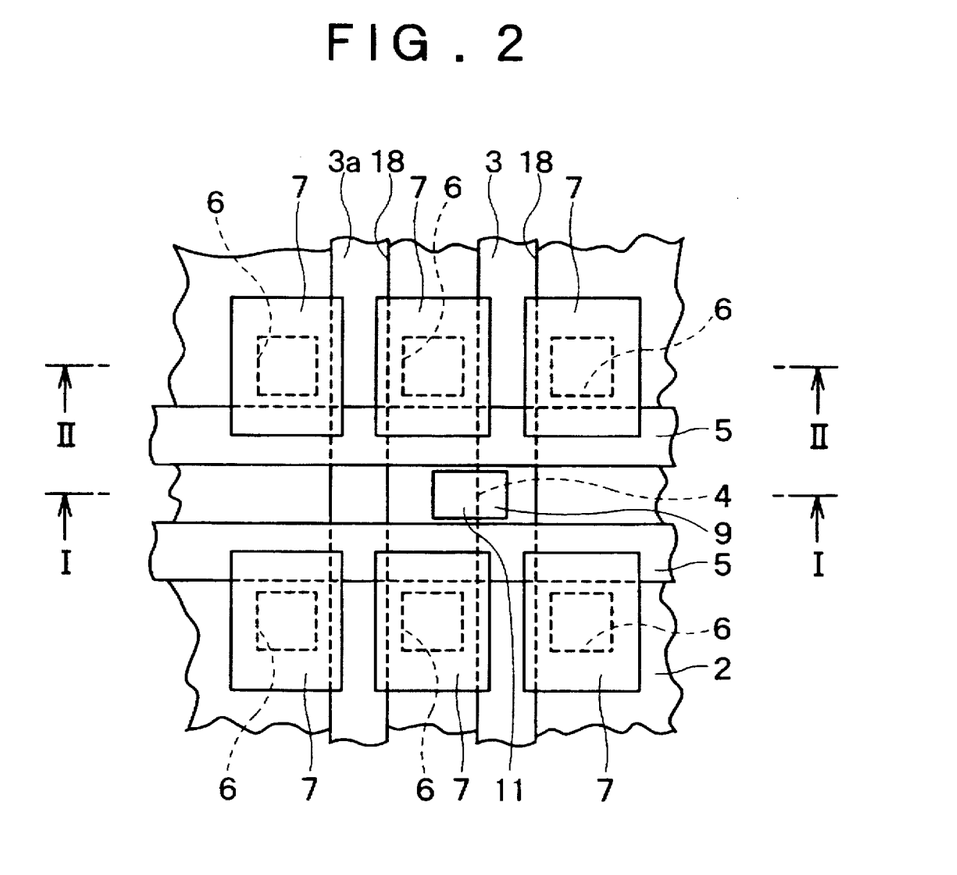
FIG. 2 is a an view showing the first embodiment of a semiconductor device with a buried wiring layer according to the present invention.
Figure 3A:
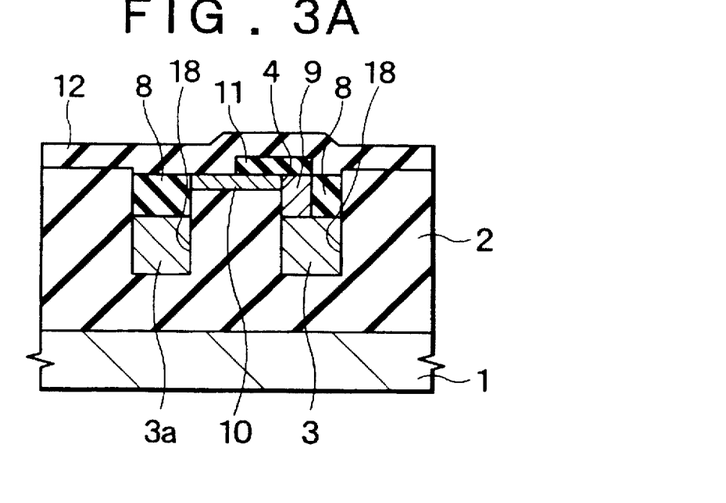
FIG. 3A is a section taken along line I—I of FIG. 2.
Figure 3B:
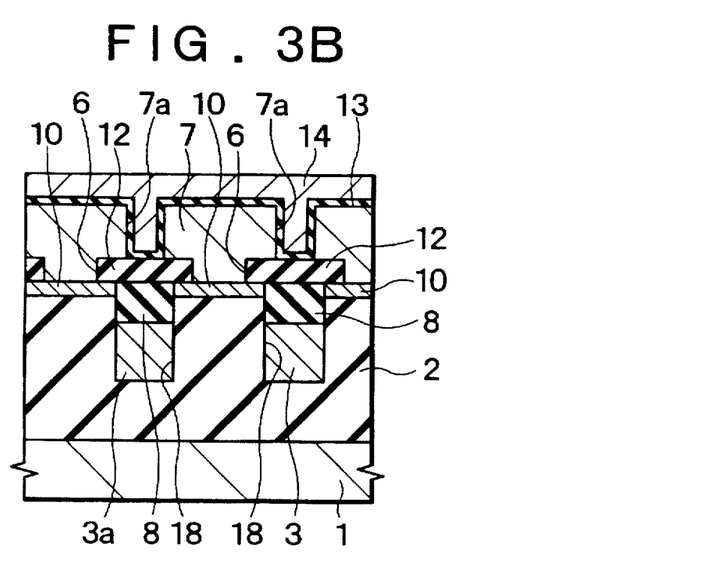
FIG. 3B is a section taken along line II—II of FIG. 2.

FIG. 2 is a plan view showing the first embodiment of a semiconductor device with a buried wiring layer according to the present invention. FIG. 3A is a section taken along line I—I of FIG. 2 and FIG. 3B is a section taken along line II—II of FIG. 2. In the shown embodiment, a semiconductor device according to the present invention is applied as a memory cell of a DRAM mounting a stack type capacitor. It should be noted that, opposing electrode 14, a capacitance insulation layer 13, an interlayer insulation layer 12, a diffusion layer 10 and a cap insulation layer 8 shown in FIGS. 3A and/or 3B are neglected from illustration in FIG. 2.

As shown in FIGS. 2, 3A and 3B, an insulation layer (first insulation layer) 2 is formed on a silicon substrate (semiconductor substrate) 1. At the surface of the insulation layer 2, grooves 18 are selectively formed. In a lower half of the groove 18, buried bit lines (buried wiring layers) 3 and 3a are buried. A connecting conductor layer 9 is selectively formed on the side wall surface of the groove 18 in the portion above the buried bit line 3. In the portion where the connecting conductor layer 9 is not formed, the cap insulation layers 8 (second insulation layers) are formed to fill the grooves 18.

A diffusion layer 10 is selectively formed at the surface of the insulation layer 2. The diffusion layer 10 and the buried bit line 3 are electrically connected through the connecting conductor layer 9 via a contact hole 4 for the bit line. A protective insulation layer 11 is formed on a region extending from the surface of the connection conductor layer 9 to a part of the surface of the diffusion layer 10. Also, on these surfaces, two word lines (upper wiring layer) 5 extending in the direction perpendicular to the grooves 18 are formed on both sides of the protective insulation layer 11. The word line 5 also serves as a gate electrode of a MOS transistor of the memory cell.

Also, over the surface, an interlayer insulation layer 12 is selectively formed. In a region shown in FIG. 3A, the interlayer insulation layer 12 is formed over the entire surface of the insulation layer 2, the cap insulation layer 8, the diffusion layer 10 and the protective insulation layer 11. On the other hand, in the region shown in FIG. 3B, the contact hole 6 for capacitor reaching to a part of the diffusion layer 10 is selectively provided in the interlayer insulation layer 12.

Also, in the region shown in FIG. 3B, an information accumulation electrode 7 is formed on the surface. The information accumulation electrode 7 and the diffusion layer 10 are electrically connected via the contact hole 6 for the bit line. Opening portions 7a reaching to the surface of the interlayer insulation layer 12 are selectively provided at the information accumulation electrode 7. The capacitance insulation layer 13 is formed on the upper surface of the information accumulation electrode 7, the side wall surface and the bottom surface of the opening portions 7a. Furthermore, on these surfaces, the opposing electrode 14 is formed to fill the opening portions 7a. By this, a capacitor is formed.

Next, a fabrication process of the semiconductor device constructed as set forth above will be discussed. FIGS. 4A to 4J are sections showing the fabrication process of the first embodiment of a fabrication process of the semiconductor device with the buried wiring layer according to the present invention, in the sequential order of process steps. FIGS. 4A to 4J illustrate sections along the direction shown in line I—I of FIG. 2.

Figure 4A:
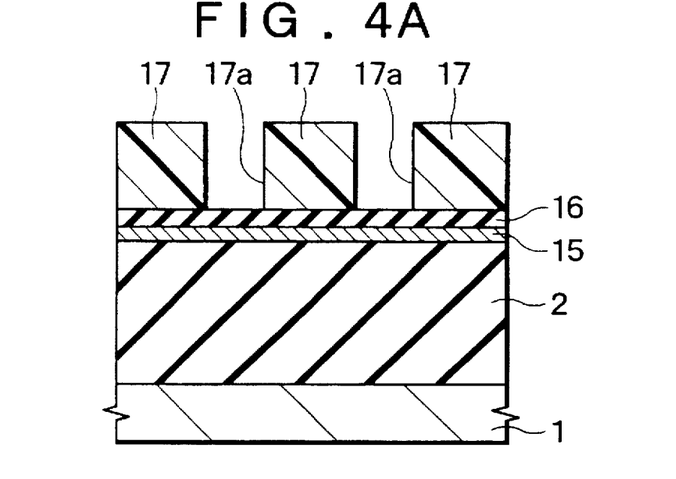
FIGS. 4A to 4J are sections showing the fabrication process of the first embodiment of a fabrication process of the semiconductor device with a buried wiring layer according to the present invention, in the sequential order of process stops.

As shown in FIG. 4A, at first, the insulation layer (first insulation layer) 2 of a silicon oxide layer is formed in a thickness of approximately 500 nm on the silicon substrate (semiconductor substrate) 1. Next, an SOI layer (semiconductor layer) 15 is formed in a thickness of 50 nm on the insulation layer 2. The SOI layer 15 is formed by a known lamination method of silicon substrate. Next, a mask insulation layer (second insulation layer) 16 of silicon nitride layer is formed in a thickness of 150 nm over the entire surface of the SOI layer 15, by way of chemical vapor deposition method (CVD method). Thereafter, a resist film (not shown) is formed on the mask insulation layer 16. Then, opening portions 17a are provided at the resist film utilizing photolithography to form a resist mask 17.

Figure 4B:
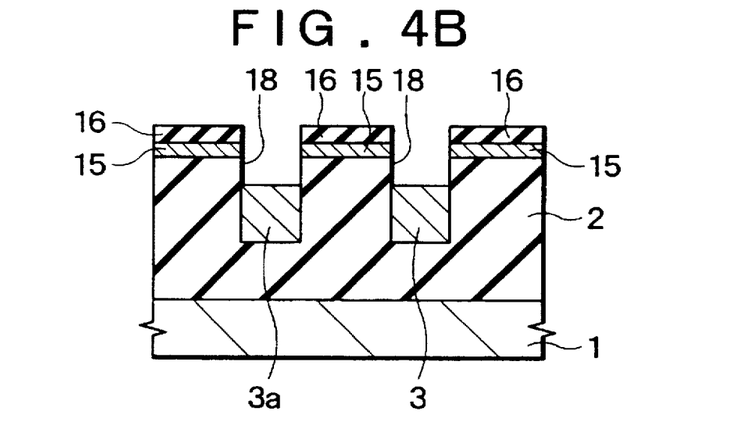

Subsequently, as shown in FIG. 4B, the mask insulation layer 16 and the SOI layer 15 are selectively removed by anisotropic etching with taking the resist mask 17 as an etching mask. Subsequently, the insulation layer 2 is removed by anisotropic etching. At this time, an etching period is strictly controlled so that the insulation layer 2 is removed in a depth of approximately 300 nm from the surface. By this, the grooves 18 for forming the buried wiring layer, are formed. The width of the groove 18 is set to be about 200 nm. An interval between the bottom surface of the groove 18 and the surface of the silicon substrate 1 is about 200 nm.

Thereafter, the resist mask 17 is removed. Then, over the entire surface, a polycrystalline silicon layer (not shown) doped with a large amount of phosphorous as impurity, is deposited by CVD method. In this process step, the thickness of the polycrystalline silicon layer to be deposited is set to completely fill the grooves 18. In the shown embodiment, the width of the groove 18 is about 200 nm. Therefore, the polycrystalline silicon layer is deposited in a thickness greater than or equal to 100 nm, e.g. about 150 nm.

Then, the surface of the polycrystalline silicon layer is etched back by anisotropic dry etching to form the buried bit lines (buried wiring layer) 3 and 3a by leaving the polycrystalline silicon layer only in the lower portion of the grooves 18. In this process step, an etching back period is strictly controlled so that the residing polycrystalline silicon layer, namely the buried bit lines 3 and 3a, becomes about 200 nm. In the shown embodiment, the buried bit lines 3 and 3a, of the polycrystalline silicon layer doped with the large amount of phosphorous, as impurity, are formed. In the present invention, it is also possible to form the buried bit line of silicide layer, such as tungsten silicide layer or the like.

Figure 4C:
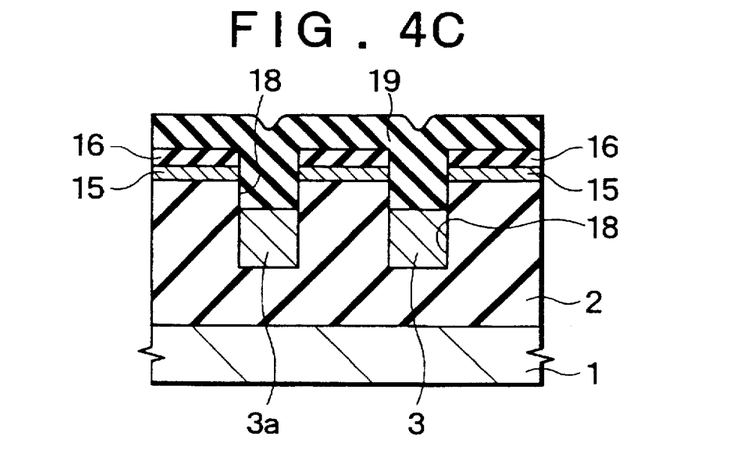

Subsequently, as shown in FIG. 4C, a silicon oxynitride layer 19 is formed in a thickness of about 150 nm over the entire surface by plasma CVD method. By this, the grooves 18 are filled with the silicon oxy-nitride layer 19.

Figure 4D:
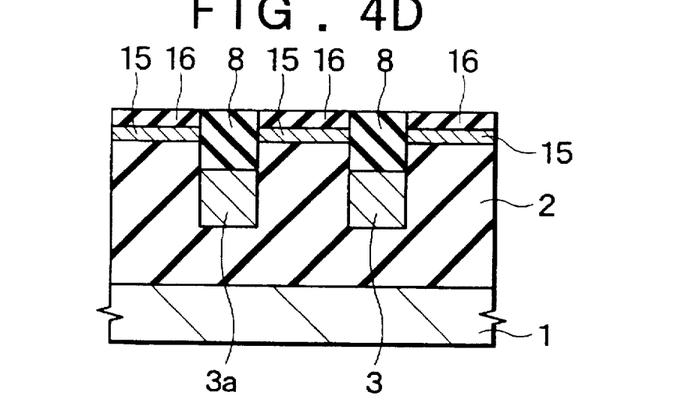

Thereafter, as shown in FIG. 4D, the surface of the silicon oxy-nitride layer 19 is polished for planarization by way of chemical mechanical polishing method (CMP method). In the CMP process, an abrasive material which selectively polish the silicon oxy-nitride layer, is used. In the polishing process, since the mask insulation layer 16 and the silicon oxy-nitride layer 19 are formed by different material, when the surface of the mask insulation layer 19 is exposed, the mask insulation layer 16 serves as stopper to leave the silicon oxy-nitride layer 19 only in the upper half of the grooves 18. By this, the cap insulation layer (third insulation layer) 8 of silicon oxy-nitride is formed filling the grooves 18 on the bit lines 3 and 3a. Then, the surface is completely planarized.

Figure 4E:
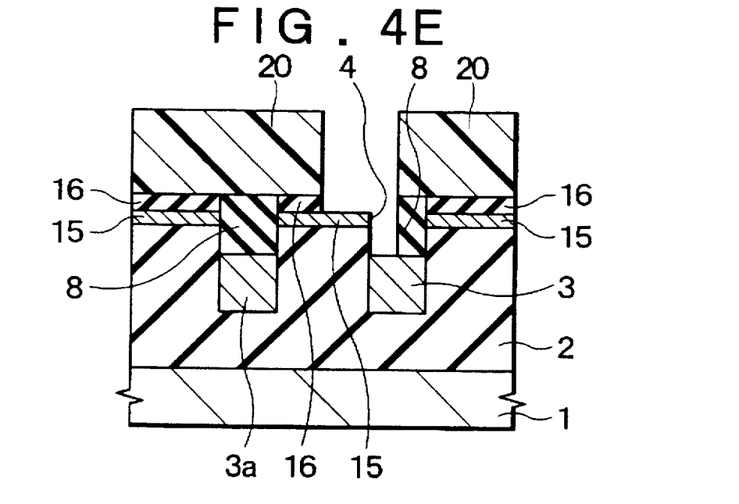

Thereafter, as shown in FIG. 4E, a resist mask 20 is formed over the entire surface. By photolithography, the resist layer 20 is selectively removed to expose a part of the cap insulation layer 8 and a part of the mask insulation layer 16 to provide the opening portion at the resist mask 20. Subsequently, a part of the mask insulation layer 16 and a part of the cap insulation layer 8 is selectively removed by anisotropic dry etching using the resist mask 20 as the etching mask. In this process step, an etching gas is selected so that the mask insulation layer 16 of the silicon nitride layer and the cap insulation layer 8 of the silicon oxy-nitride can be easily etched in comparison with the bit line 3 of the polycrystalline silicon and SOI layer 15. Accordingly, etching can be stopped at the surface of the SOI layer 15 and the surface of the buried bit line 3. By this, the contact hole 4 for the bit line is formed.

Figure 4F:
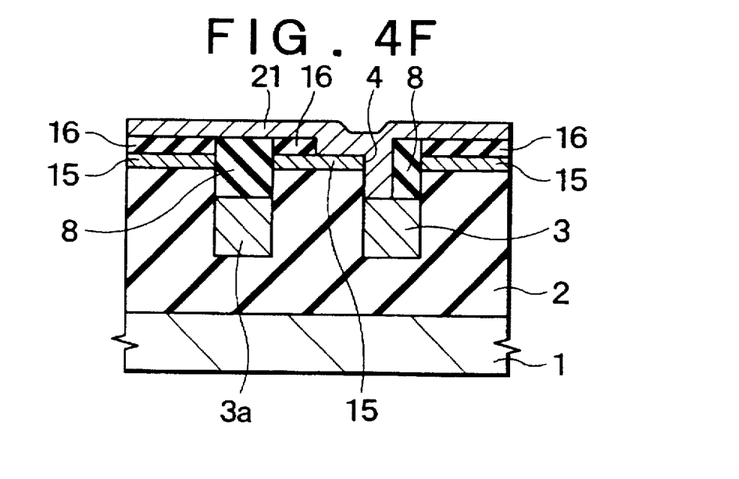

Thereafter, as shown in FIG. 4F, the resist mask 20 is removed. Then, a polycrystalline silicon layer 21 doped with phosphorous as impurity, is deposited over the entire surface. In this process step, the thickness of the polycrystalline silicon layer 21 is set so that the contact hole 4 for the bit line can be completely buried by the polycrystalline silicon layer 21. For example, assuming that the width of the contact hole 4 for the bit line is about 200 nm, the polycrystalline silicon layer 21 may be deposited in a thickness of 150 nm.

Figure 4G:
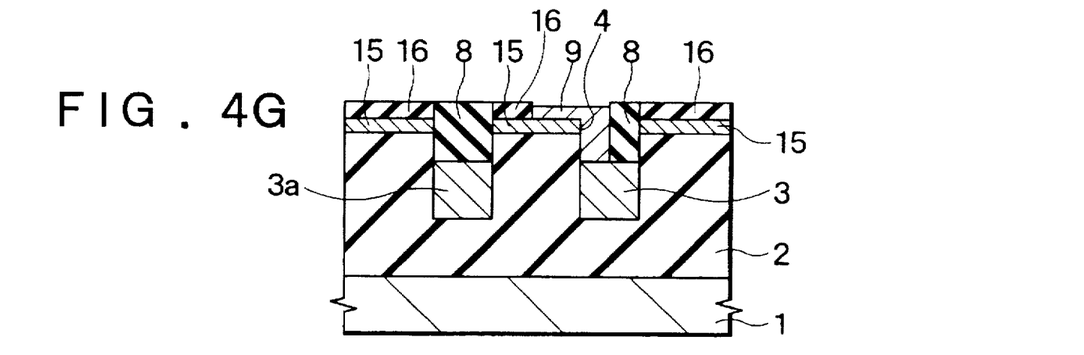

Subsequently, as shown in FIG. 4G, the surface of the polycrystalline silicon layer 21 is polished by CMP method. In the polishing process, the CMP period is strictly controlled so that the polycrystalline silicon layer 21 is left in a thickness about 20 nm on the upper surface of the SOI layer 15. By this, the connection conductor layer (conductor portion) 9 of the polycrystalline silicon is formed within the contact hole 4 for the bit line. Thus, the buried bit line 3 and the SOI layer 15 are connected electrically.

Figure 4H:
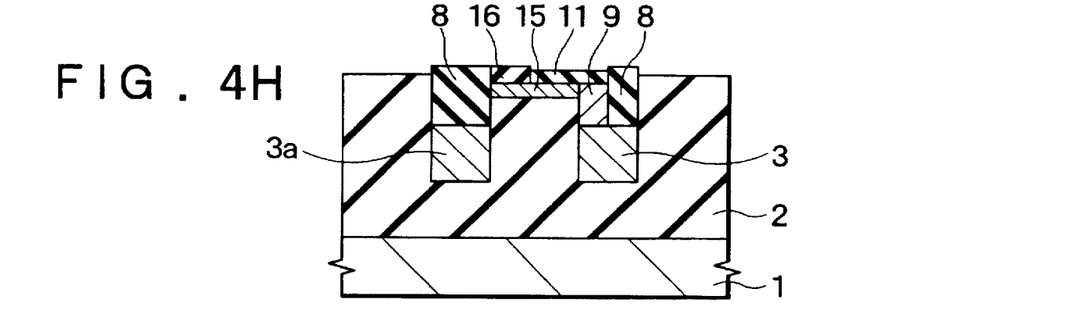

Thereafter, as shown in FIG. 4H, the mask insulation layer 16 is selectively removed by photolithography and dry etching. Thereafter, the entire surface is thermally oxidized. In the thermal oxidization process, a condition is set so that the SOI layer 15 exposed by removal of the mask insulation layer 16 is completely oxidized. On the other hand, the SOI layer 15 present between cap insulation layers 8 should influenced by thermal oxidation. Therefore, a condition for thermal oxidation is selected so that a thickness of the portion which does not influenced by the thermal oxidation, is greater than or equal to 30 nm. By this, the SOI layer 15 exposed on the surface is oxidized to be integrated by the insulation layer 2. In conjunction therewith, the surface of the connection conductive layer 9 is oxidized to form the protective insulation layer 11.

Figure 4I:
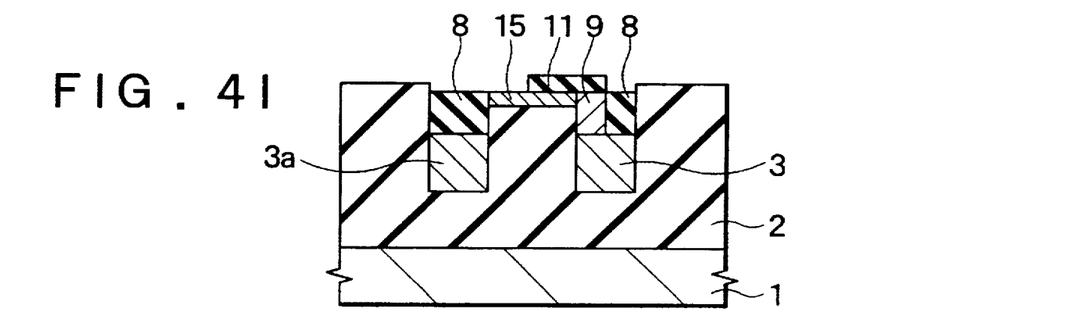

Then, as shown in FIG. 4I, the entire surface of these is polished by the CMP method. In this process, the abrasive material which can selectively remove the cap insulation layer 8 and the mask insulation layer 16 by polishing, is used. By this, the upper surface of the cap insulation layer 8 is polished and the mask insulation layer 16 is removed to expose a part of the SOI layer 15.

Figure 4J:
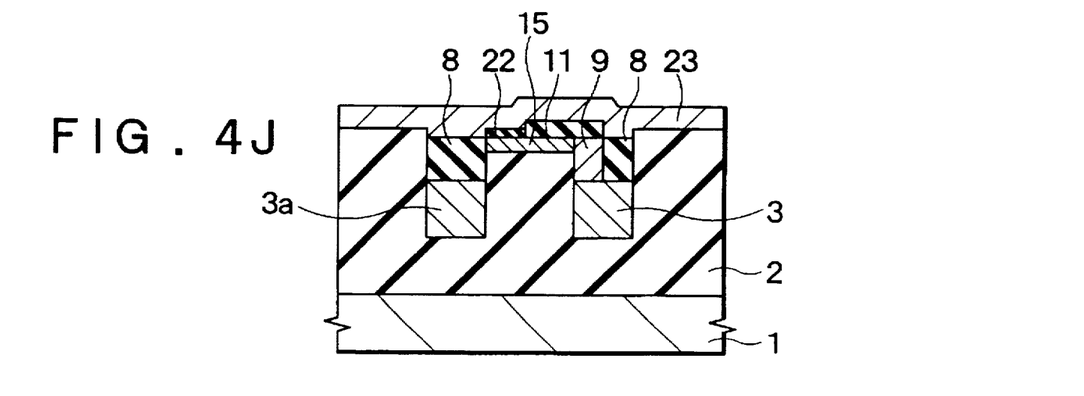

Thereafter, as shown in FIG. 4J, a gate oxide layer (fourth insulation layer) 22 is formed on the surface of the exposed SOI layer 15 in a thickness of about 8 nm. Thereafter, over the entire surface, a gate conductor layer 23 is formed by CVD method. The gate conductor layer 23 is formed of polycrystalline silicon, tungsten silicide or so forth.

Subsequently, the gate conductor layer 23 and the gate oxide layer 22 are patterned by photolithography and anisotropic dry etching. By this, the word line (upper wiring layer) 5 is formed at the position shown in FIG. 2. The word line 5 also serves as the gate electrode of the MOS transistor (insulated gate type field effect transistor) of the memory cell. Accordingly, in the region shown in FIG. 4J, the gate conductive layer 23 and the gate insulation layer 22 are removed. Subsequently, the SOI layer 15 becomes an N-type diffusion layer 10 containing arsenic by introducing arsenic as impurity in these surface in self-alignment with the word line 5.

Thereafter, as shown in FIGS. 3A and 3B, the interlayer insulation layer 12 is deposited over the entire surface in a thickness of about 200 nm. Then, the contact holes 6 for capacitor are provided in the predetermined position in the interlayer insulation layer 12. Subsequently, a polycrystalline silicon layer containing phosphorous as impurity is deposited over the entire surface in a thickness of about 300 nm by way of CVD method. Then, the polycrystalline silicon layer is selectively removed by photolithography and anisotropic dry etching to form the information accumulation electrode 7. In the region shown in FIG. 3B, opening portions 7a to expose parts of the surface of the interlayer insulation layer 12 are provided between contact holes 6 for capacitor by selectively removing the information accumulation electrode 7 by etching.

Thereafter, the capacity insulation layer 13 of silicon nitride layer is formed in a thickness of 5 nm, for example, on the upper surface of the information accumulation layer 7, and the side wall surface and the bottom surface of the opening portions 7a, by CVD method. Then, the opposing electrode 14 of polycrystalline silicon layer containing large amount of impurity, such as phosphorous is formed over the entire surface in a thickness of about 100 nm by way of CVD method.

As set forth above, in the memory cell having the stack-type capacitor, the buried bit line can be formed within the insulation layer of the SOI type semiconductor substrate.

In the first embodiment constructed as set forth above, since the buried bit lines 3 and 3a are formed within the insulation layer 2 of the SOI type semiconductor substrate, it becomes unnecessary to form the insulation layer for insulating between the bit lines 3 and 3a and the silicon substrate 1 within the groove 18. Accordingly, it becomes unnecessary to narrow the width of the buried bit lines 3 and 3a to avoid increasing of the wiring resistance of the bit line.

Also, in the shown embodiment, since the interval between the bottom surface of the groove 18 and the surface of the silicon substrate 1 is about 200 nm, the bit lines and the silicon substrate can be insulated with the sufficient thickness of the insulation layer. Therefore, parasitic capacitance of the buried bit lines 3 and 3a becomes small.

On the other hand, in the shown embodiment, since the buried bit lines 3 and 3a and the word line 5 are insulated by the insulation layer, even when these lines are formed in the directions perpendicularly intersecting with each other, they may not cause shorting at a position other than the predetermined position.

As set forth above, since the wiring resistance of the buried bit lines 3 and 3a can be made small and parasitic capacitance of the bit lines can also be made small, the operation speed of the semiconductor device can be made higher to enhance performance of the device. Also, even when the width of the groove 18 for forming the bit lines 3 and 3a is defined by extreme of resolution in the photolithography, high performance semiconductor device can be obtained. Thus, the chip area can be reduced to achieve increased package density.

For example, in the shown embodiment, the operation speed of DRAM can be increased to be about 5% higher than the conventional semiconductor device. Also, parasitic capacitance of the buried bit lines 3 and 3a can be reduced in the extent of about 20% of the conventional semiconductor device. In addition, since number of memory cells connected to one sense amplifier is increased, number of sense amplifier can be reduced to permit to reduce the chip area in the extent of about 10% of the conventional semiconductor device. It should be appreciated that when the interval between the bit lines 3 and 3a (the bottom surface of the grooves 18) and the silicon substrate 1 is greater than or equal to 100 nm, the parasitic capacitance of the bit line can be made smaller than that of the conventional structure.

The present invention should not be limited to the configuration and fabrication process as discussed in the first embodiment, but other configuration and fabrication process may be applicable. FIGS. 5A to 5E are sections showing the fabrication process of the second embodiment of the fabrication process of the semiconductor device with the buried wiring layer according to the present invention, in the sequential order of process steps. FIGS. 5A to 5E illustrate sections along the direction shown in line I—I of FIG. 2, similarly to FIGS. 4A to 4J. It should be noted that, in the second embodiment illustrated in FIGS. 5A to 5E, like elements to those in the first embodiment will be identified by like reference numerals and the detailed discussion therefor will be neglected to keep the disclosure simple enough to facilitate clear understanding of the present invention.

Figure 5A:
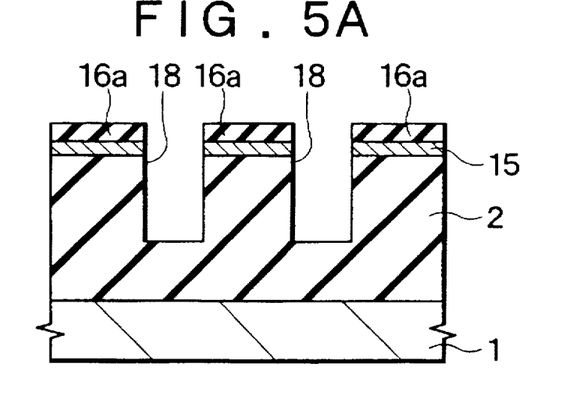
FIGS. 5A to 5E are sections showing the fabrication process of the second embodiment of a fabrication process of the semiconductor device with a buried wiring layer according to the present invention, in the sequential order of process steps.

As shown in FIG. 5A, at first, the insulation layer (first insulation layer) 2 is formed on the silicon substrate (semiconductor substrate) 1 in a thickness of about 500 nm. The SOI layer (semiconductor layer) 15 is formed in a thickness of about 50 nm on the insulation layer 2. By this, SOI type semiconductor substrate is formed. Then, a mask insulation layer 16 of silicon oxide layer is formed in a thickness of about 50 nm on the SOI layer 15 by way of CVD method. Subsequently, the mask insulation layer 16a, the SOI layer 15 and the insulation layer 2 are selectively removed by photolithography and anisotropic dry etching to form the grooves 18. Similarly to the first embodiment, the groove 18 is provided in a depth of about 300 nm from the surface of the insulation layer 2, and in a width of about 200 nm.

Figure 5B:
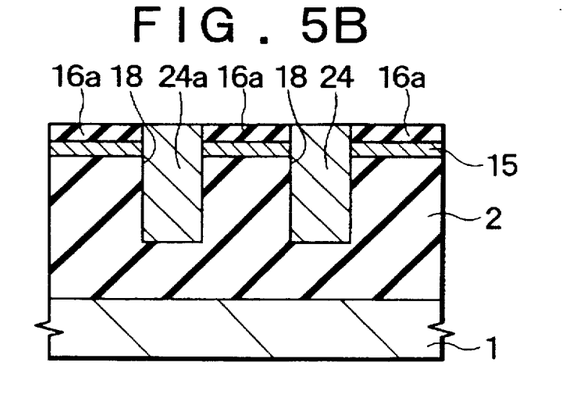

Subsequently, as shown in FIG. 5B, the polycrystalline silicon layer containing a large amount of phosphorous as impurity, for example, is deposited over the entire surface in a thickness of about 150 nm by way of CVD method. Subsequently, the entire surface is etched back by anisotropic dry etching to leave the polycrystalline silicon only within the groove 18 to form buried bit lines (buried wiring layer) 24 and 24a. At this time, it is also possible that, in stead of performing etching back the entire surface by anisotropic dry etching, polishing of the surface by CMP method may be performed for forming the buried bit lines 24 and 24a. Also, as the material for the buried bit lines 24 and 24a, silicide layer may be used in place of the polycrystalline silicon layer.

Figure 5C:
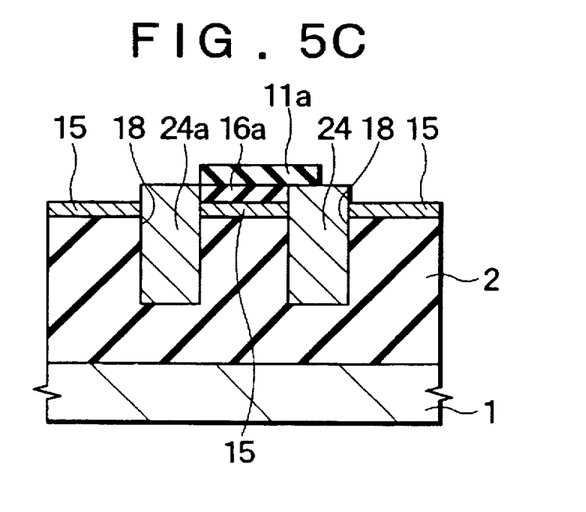

Thereafter, as shown in FIG. 5C, the silicon nitride layer (not shown) is deposited over the entire surface in the thickness of about 200 nm. Then, the silicon nitride layer is patterned by way of photolithography and dry etching. By this, the protective insulation layer 11a is formed on a part of the surface of the mask insulation layer 16a and a part of the surface of the buried bit line 24. Then, the mask insulation layer 16a not covered with the protective insulation layer 11a is removed.

Figure 5D:
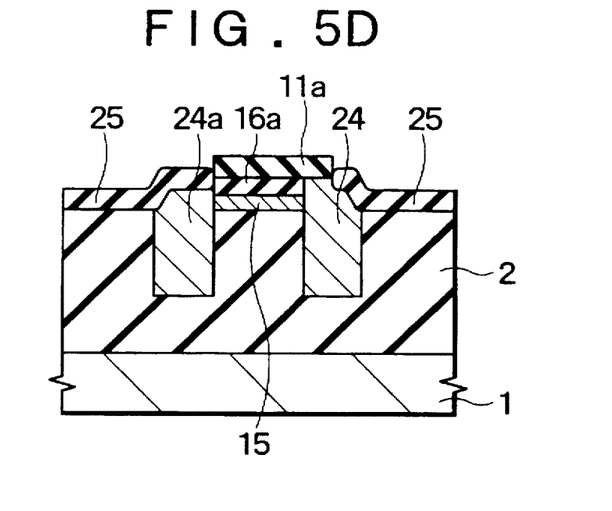

Next, as shown in FIG. 5D, the surfaces of the SOI layer 15 and the buried bit lines 24 and 24a are subject to thermal oxidation with taking the protective insulation layer 11a as a mask. By this, the thermally oxidized region in the surfaces of the SOI layer 15 and the buried bit lines 24 and 24a is insulated to form the cap insulation layer 25.

Figure 5E:
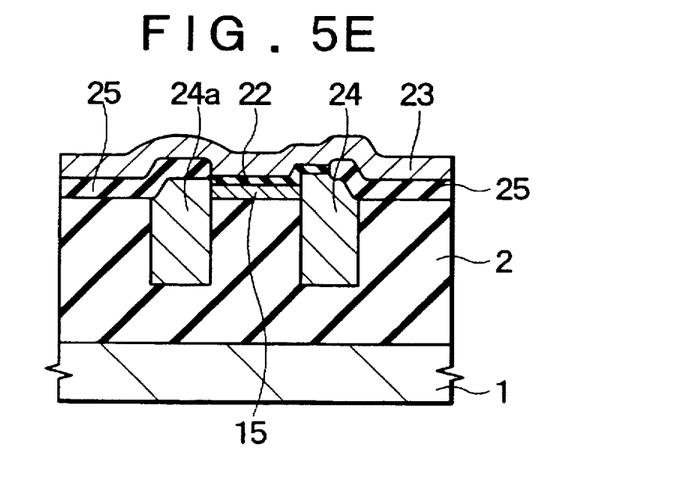

Subsequently, as shown in FIG. 5E, the protective insulation layer 11a and the mask insulation layer 16a beneath the protective insulation layer 11a are removed by wet etching. Then, a gate oxide layer 22 is formed on the surface of the SOI layer 15 and the buried bit line 24 in the region not covered with the cap insulation layer 25. Thereafter, the gate conductive layer 23 is deposited over the entire surface.

Thereafter, the gate conductive layer 23 is selectively removed by photolithography and anisotropic dry etching to form the word line (not shown). Subsequently, as impurity, arsenic is introduced into the surface to form the diffusion layer from the SOI layer 15.

Then, similarly to the first embodiment, the interlayer insulation layer, the contact holes for capacitor, the information accumulation electrode, the capacity insulation 1a and the opposing electrode are formed for completing the second embodiment of the semiconductor device with the buried wiring layer.

As set forth, even in the second embodiment of the semiconductor device fabricated as set forth above, similarly to the first embodiment, since the buried bit lines 24 and 24a are formed within the insulation layer 2 of the SOI type semiconductor substrate, it becomes unnecessary to make a width of the bit lines 24 and 24a narrower to avoid increasing of the wiring resistance of the bit line.

Also, in the shown embodiment, since the interval between the bit lines 24 and 24a and the silicon substrate 1 can be sufficiently thick, parasitic capacitance of the bit lines 24 and 24 a becomes small. Thus, the operation speed of the semiconductor device can be made higher to enhance the performance of the semiconductor device. Thus, the chip area can be reduced to contribute for increasing of the package density.

It should be noted that while the cap insulation layer 25 is formed of the silicon oxide obtained through thermal oxidation in the shown embodiment, it is possible, in the present invention, to form the cap insulation layer of the silicon nitride in place of the silicon oxide layer. In this case, the protective insulation layer 11a of the silicon oxide layer may be formed.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

In the foregoing first and second embodiment, discussion has been given for the construction, in which the buried wiring layer forms the bit line of DRAM, the present invention should not be limited to the shown specific construction, and is applicable for any semiconductor device, in which a part of the wiring layer is buried in the insulation layer. Also, the specific dimensions, such as width, depth and so forth, numerically set forth above should be understood as mere examples for facilitating understanding of the invention, and therefore, the present invention should not be limited to such specific dimensions. Furthermore, the materials of respective layers should be understood as mere examples and can be varied in various ways.

What is claimed is:

1. A semiconductor device with a buried wiring layer comprising:

a semiconductor substrate;

a first insulation layer formed on said semiconductor substrate;

a semiconductor layer selectively formed on said first insulation layer;

a groove formed in said first insulation layer in contact with said semiconductor layer, said groove having a depth smaller than a thickness of said first insulation layer;

a buried wiring layer buried within said groove;

a conductor portion electrically connecting said buried wiring layer and said semiconductor layer;

a second insulation layer buried within said groove above said buried wiring layer; and an upper wiring layer formed above said second insulation layer.

2. A semiconductor device as set forth in claim 1, wherein said first insulation layer is formed of silicon oxide, and said second insulation layer is formed of silicon oxy-nitride.

3. A semiconductor device as set forth in claim 1, wherein said upper wiring layer extends above said semiconductor layer, and a third insulation layer is formed between said upper wiring layer and said semiconductor layer.

4. A semiconductor device as set forth in claim 1, which further comprises an interlayer insulation layer formed above said upper wiring layer.

5. A semiconductor device as set forth in claim 1, wherein an interval between a bottom surface of said groove and a surface of said semiconductor substrate is greater than or equal to 100 nm.

6. A semiconductor device as set forth in claim 1, wherein a thickness of said semiconductor layer is greater than or equal to 30 nm.

7. A semiconductor device with a buried wiring layer comprising:

a semiconductor substrate;

a first insulation layer formed on said semiconductor substrate;

a semiconductor layer selectively formed on said first insulation layer;

a groove formed in said first insulation layer in contact with said semiconductor layer, said groove having a depth smaller than a thickness of said first insulation layer;

a buried wiring layer buried within said groove in contact with said semiconductor layer;

a second insulation layer formed on said buried wiring layer, said semiconductor layer and said first insulation layer; and an upper wiring layer formed above said second insulation layer.

8. A semiconductor device as set forth in claim 7, which further comprises an interlayer insulation layer formed above said upper wiring layer.

9. A semiconductor device as set forth in claim 7, wherein an interval between a bottom surface of said groove and a surface of said semiconductor substrate is greater than or equal to 100 nm.

10. A semiconductor device as set forth in claim 7, wherein a thickness of said semiconductor layer is greater than or equal to 30 nm.

* * * * *